United States Patent
Jung

(10) Patent No.: US 7,595,267 B2
(45) Date of Patent: Sep. 29, 2009

(54) METHOD OF FORMING CONTACT HOLE OF SEMICONDUCTOR DEVICE

(75) Inventor: Woo Yung Jung, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 110 days.

(21) Appl. No.: 11/951,334

(22) Filed: Dec. 6, 2007

(65) Prior Publication Data
US 2008/0200035 A1    Aug. 21, 2008

(30) Foreign Application Priority Data
Feb. 15, 2007    (KR)    ........... 10-2007-0015909

(51) Int. Cl.
*H01L 21/44*    (2006.01)
(52) U.S. Cl. ............... 438/672; 257/E21.577
(58) Field of Classification Search ......... 438/672; 257/E21.577
See application file for complete search history.

(56) References Cited

U.S. PATENT DOCUMENTS

| | | | |
|---|---|---|---|
| 6,171,940 B1 * | 1/2001 | Huang | 438/585 |
| 7,049,255 B2 * | 5/2006 | Oyama et al. | 501/64 |
| 7,253,099 B2 * | 8/2007 | Hwang et al. | 438/637 |
| 2006/0273456 A1 * | 12/2006 | Sant et al. | 257/734 |
| 2007/0015356 A1 * | 1/2007 | Lee et al. | 438/637 |

FOREIGN PATENT DOCUMENTS

| | | |
|---|---|---|
| JP | 2004140415 A | 5/2004 |
| KR | 1019970053056 A | 7/1997 |
| KR | 1020070106277 A | 11/2007 |

OTHER PUBLICATIONS

Toshiyuki Toyoshima et al., "0.1 µm Level contact Hole Pattern Formation with KrF Lithography by Resolution Enhancement Lithography Assisted by Chemical Shrink (RELACS)", paper, Sep. 1998, Mitsubishi Electric Corp., Hyogo, Japan.
Laura J. Peters, "Resists Join the Sub-I Revolution", paper, Sep. 1, 1999, Semiconductor International, online www.semiconductor.net/index.asp?layout=articlePrint&ArticleID=....

* cited by examiner

*Primary Examiner*—W. David Coleman
(74) *Attorney, Agent, or Firm*—Townsend and Townsend and Crew LLP

(57) ABSTRACT

A method of forming a contact hole of a semiconductor device is disclosed. At the time of a hard mask formation process for forming a contact hole of a semiconductor device, first patterns are formed using a photoresist pattern employing an exposure process. Spacers having a predetermined thickness are formed on sidewalls of the first patterns using an amorphous carbon layer. Spaces between the first patterns including the spacers are gap filled to form second patterns. Accordingly, a contact hole having a pitch with exposure equipment resolution or less can be formed.

12 Claims, 5 Drawing Sheets

METHOD OF FORMING CONTACT HOLE OF SEMICONDUCTOR DEVICE

CROSS-REFERENCES TO RELATED APPLICATIONS

The present application claims priority to Korean patent application number 10-2007-15909 filed on Feb. 15, 2007, which is incorporated by reference in its entirety.

BACKGROUND OF THE INVENTION

The present invention relates to a method of forming a contact hole of a semiconductor device and, more particularly, to a method of forming a contact hole having a micro pattern size.

In general, a semiconductor device consists of a number of unit elements. As a semiconductor device is highly integrated, semiconductor elements must be formed on a predetermined cell area with a high density. Due to this, the size of a unit element, such as a transistor or a capacitor, gradually decreases. In particular, in semiconductor memory devices such as Dynamic Random Access Memory (DRAM), the size of semiconductor elements formed within a cell is decreased as the design rule is reduced. In recent years, a minimum line width of a semiconductor DRAM device is 0.1 nm or less and even requires 60 nm or less. Thus, many difficulties occur in a manufacturing process of semiconductor elements constituting a cell.

In semiconductor devices having a line width of 60 nm or less, if a photolithography process is performed using ArF exposure having a wavelength of 193 nm, additional requirements, such as prohibition of deformation of a photoresist, which occurs during etching, are necessary in the existing etch process concepts (formation of an accurate pattern, a vertical etch profile, and so on). Accordingly, upon fabrication of semiconductor devices of 60 nm or less, it has became an important subject to develop a process condition for fulfilling the existing requirements and new requirements, such as prevention of pattern deformation, at the same time from a viewpoint of etching.

The conventional method for forming a micro contact hole of 100 nm or less, which exceeds the limit resolutions of exposure equipment, includes a method of forming a photoresist pattern for a contact hole and then heating the pattern over a glass transition temperature of a photoresist material in order to form a contact hole pattern having a size smaller than an original pattern size through flow, a method of reducing the size of a contact hole using a process employing Resist Enhancement Lithography Assisted by Chemical Shrink (RELACS) material, and so on.

In addition to the above methods, there is a need for a method for forming a micro contact hole exceeding the limit resolutions of exposure equipment.

BRIEF SUMMARY OF THE INVENTION

The present invention is directed towards a contact hole formation method using a mask having a pitch of exposure equipment resolutions or less. At the time of a hard mask formation process for forming a contact hole of a semiconductor device, first patterns are formed using a photoresist pattern employing an exposure process. Spacers having a predetermined thickness are formed on sidewalls of the first patterns using an amorphous carbon layer. Subsequently, spaces between the first patterns including the spacers are gap filled to form second patterns.

In an aspect of the present invention, a method of forming a contact hole of a semiconductor device includes forming an interlayer insulating film, a hard mask film, and an etch stop layer over a semiconductor substrate, forming first patterns on the etch stop layer, and forming spacers on sidewalls of the first patterns. The method further includes gap-filling an insulating film between the spacers, thus forming second patterns and removing the spacers of a contact hole region. A contact hole is formed through which the semiconductor substrate is exposed using an etch process employing the first and second patterns and the spacers.

The formation of the second patterns includes forming an insulating film over the entire surface including the spacers, etching the insulating film in a bit line direction where regions where subsequent contact holes will be formed are included, thereby removing the insulating film formed on the spacers, and forming the insulating film, which remains through removal of the spacers, as second patterns.

The formation of the contact hole includes etching the etch stop layer and the hard mask film by using an etch process employing the first and second patterns, thus forming hard mask patterns, and etching the interlayer insulating film by using an etch process employing the hard mask patterns, thus forming the contact hole.

The spacers are formed using an amorphous carbon layer through a cycle of deposition and etch where deposition and etch processes are repeatedly performed within a chamber. The insulating film etch process is performed using a wet etch process. The insulating film is formed using a SOG layer. The etch stop layer is formed using a PE nitride film.

In an aspect of the method, a distance between the first pattern and the second pattern is controlled by adjusting a thickness of the spacer. The method further includes, after the insulating film is gap-filled, hardening the insulating film by performing a curing process before etching the insulating film. The curing process may be performed in a temperature range of 150 to 250 degrees Celsius in order to prevent damage to the spacers.

DESCRIPTION OF SPECIFIC EMBODIMENTS

Exemplary embodiments according to the present invention will be described with reference to the accompanying drawings.

FIGS. 1A to 7 are sectional views and plan views of a semiconductor device for illustrating a method of forming a contact hole of the device according to an embodiment of the present invention.

Figure 1A:
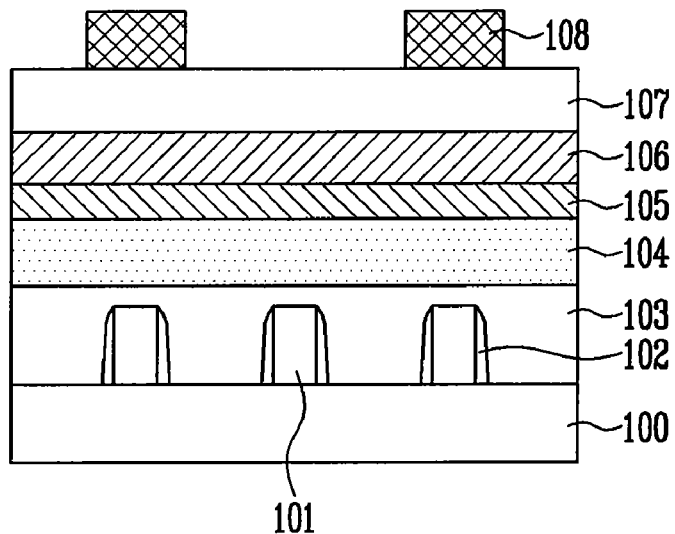
FIGS. 1A to 7 are sectional views of a device for illustrating a method of forming a contact hole according to an embodiment of the present invention.
Figure 1B:
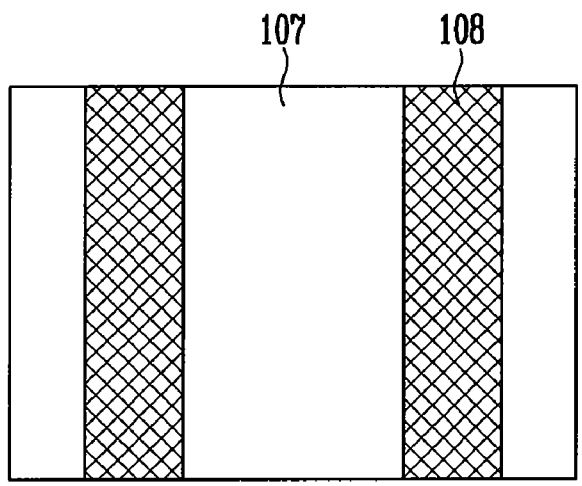

Referring to FIGS. 1A and 1B, gates 101 of a predetermined pattern are formed on a semiconductor substrate 100. An insulating film 102 is formed on sidewalls of the gates. An interlayer insulating film 103 is formed over the entire surface including the gates 101. A target etch layer 104 is formed on the interlayer insulating film 103. The target etch layer 104 may be formed using an amorphous carbon layer. An etch stop layer 105 and a polysilicon film 106 are sequentially formed over the entire surface including the target etch layer 104. The etch stop layer 105 may be formed using a PE nitride film. A bottom anti-reflective coating (BARC) layer 107 is formed over the entire surface including the polysilicon film

106. After a photoresist is coated on the BARC layer 107, photoresist patterns 108 are formed.

Figure 2A:
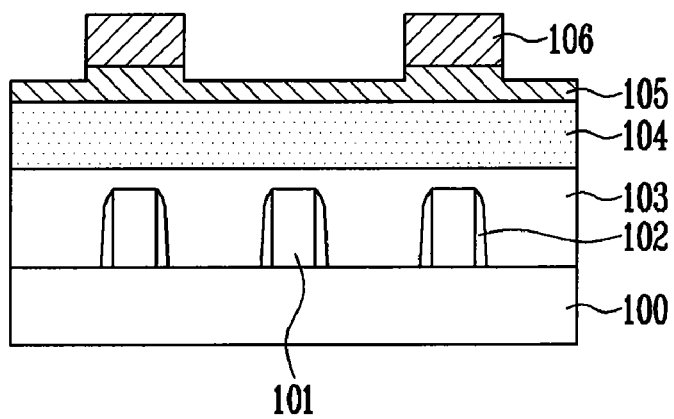
Figure 2B:
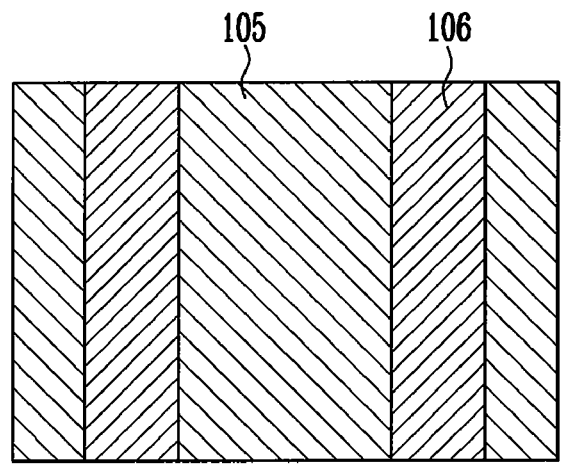

Referring to FIGS. 2A and 2B, the polysilicon film 106 is etched by an etch process using the patterned photoresist patterns 108 as a mask. The etch stop layer 105 is exposed, thereby forming first patterns 106. The photoresist patterns 108 are then removed using a strip process.

Figure 3A:
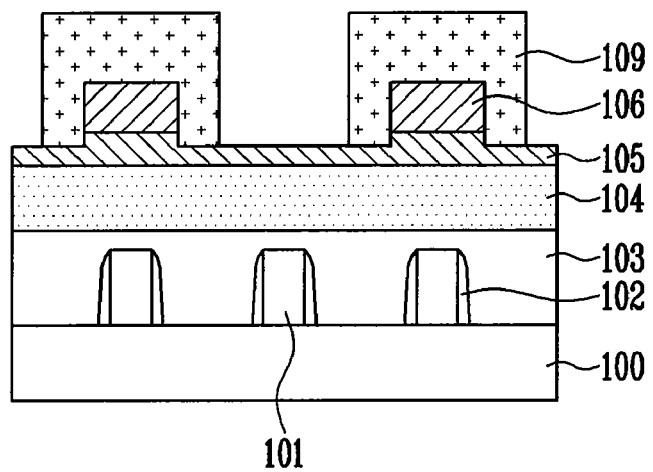
Figure 3B:
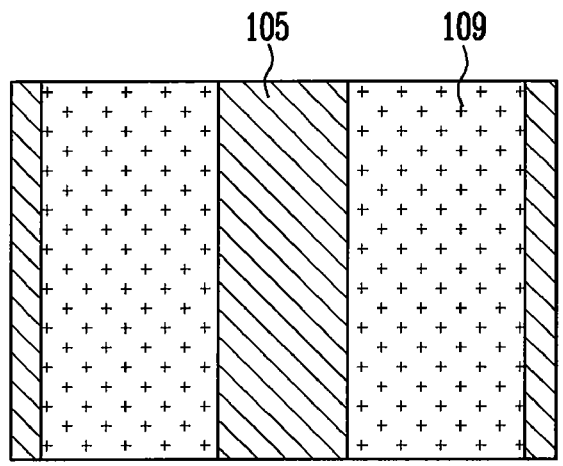

Referring to FIGS. 3A and 3B, spacers 109 are formed on sidewalls and top surfaces of the first patterns 106. The spacer 109 may be formed using an amorphous carbon layer. The amorphous carbon layer is formed through a cycle of deposition and etch processes where the deposition and etch processes are repeatedly performed within a chamber. If the amorphous carbon layer is formed using the above deposition method, the amorphous carbon layer is formed only on the sidewalls and top surfaces of the first patterns 106 to a predetermined thickness. Accordingly, the sidewalls of the amorphous carbon layer are vertically formed over the semiconductor substrate 100. Thus, an etch process for opening second pattern regions, which will be subsequently formed, can be skipped when forming the spacers 109 using other films. A distance between patterns, which will be subsequently formed, can be controlled by adjusting the thickness of the amorphous carbon layer. In other words, the thickness of the spacer 109 is directly related to the distance between patterns. The spacer 109 may be formed using other materials instead of the amorphous carbon layer. However, the amorphous carbon layer is preferably used due to the etch process for opening the second pattern regions and the problem of controlling the formation angle of the spacer 109 mentioned earlier. Furthermore, the spaces between the first patterns 106 may be filled with the spacers 109 such that a contact hole formed in a peri region of a device has a critical dimension larger than that formed in a cell region.

Figure 4A:
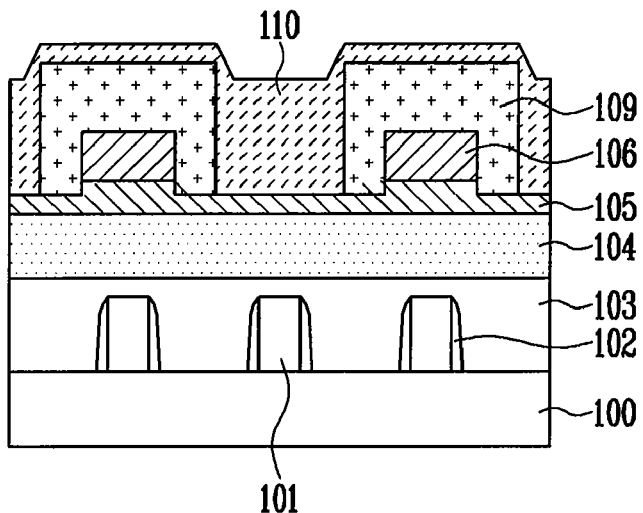

Referring to FIG. 4A, a Spin On Glass (SOG) layer 110 is formed over the entire surface including the spacers 109. The SOG layer 110 is formed to fully gap-fill the spaces between the patterns, for example, the spaces between the patterns including the spacers 109 surrounding the first patterns. A curing process is then performed to harden the SOG layer 110. In one embodiment, the curing process may be performed in a temperature range of 150 to 250 degrees Celsius in order to prevent damage to the spacers 109. In the peri region, the SOG layer 110 is formed only on top surfaces of the spacers 109 since the spaces between the first patterns 106 are gap-filled with the spacers 109.

Figure 4B:
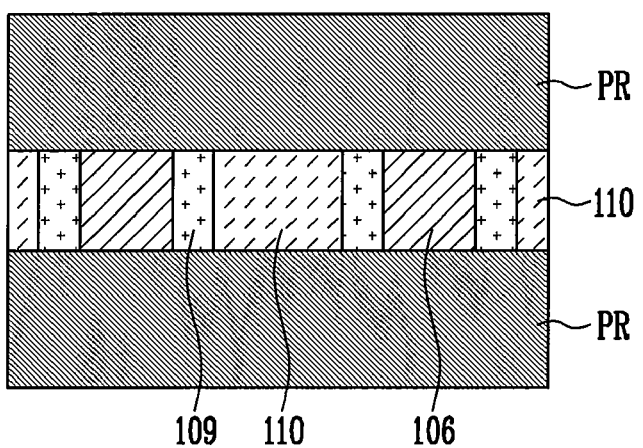

Referring to FIG. 4B, a photoresist is coated over the entire surface including the SOG layer 110. Exposure and phenomenon processes are then performed to form a photoresist pattern PR through which the SOG layer 110 is exposed in a bit line direction (in a traverse direction in the drawing) so that a region where a subsequent contact hole will be formed is included. Subsequently, the SOG layer 110 formed on the spacers 109 is removed by an etch process using the photoresist pattern PR as a mask.

Figure 4C:
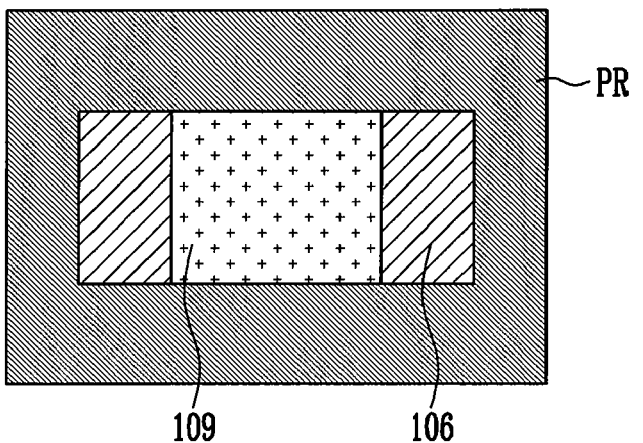

FIG. 4C is a plan view in the peri region. Referring to FIG. 4C, a photoresist is coated over the entire surface including the SOG layer 110. Exposure and phenomenon processes are then performed to form a photoresist pattern PR through which the SOG layer 110 formed over the spacers 109. The first patterns 106 is exposed so that a region where a subsequent contact hole will be formed is included. Thereafter, the SOG layer 110 formed over the spacers 109 and the first patterns 106 is removed by an etch process using the photoresist pattern PR as a mask.

Figure 5A:
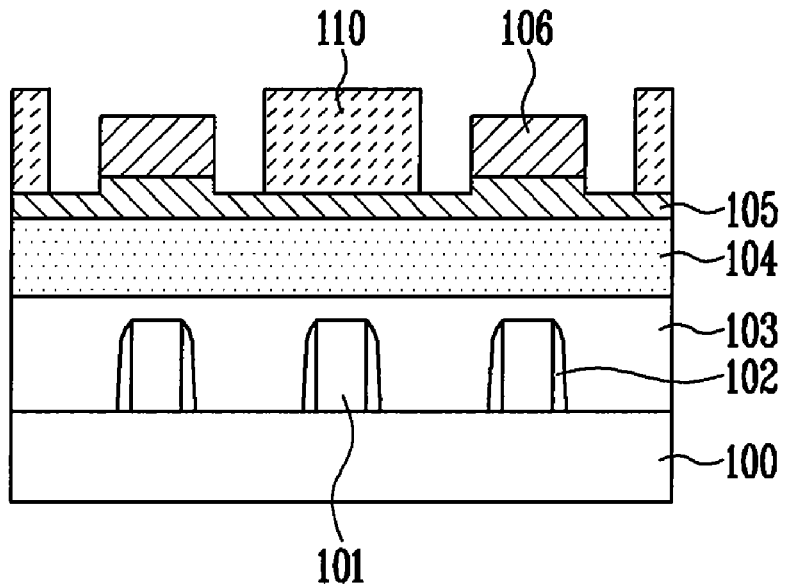
Figure 5B:
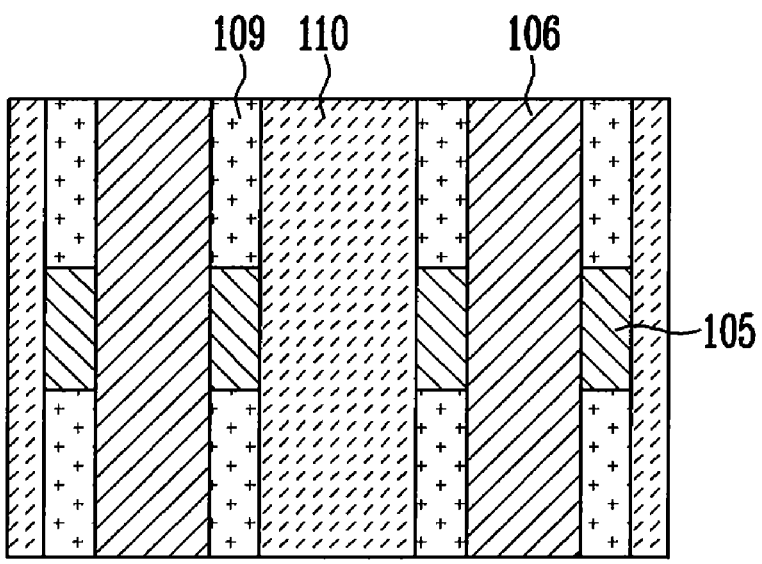

Referring to FIGS. 5A and 5B, the spacers are removed using a strip process. The strip process may be performed using an $O_2$ plasma process. Due to this, the SOG layers 110 remaining in the spaces between the spacers remain intact and thus become second patterns 110.

Figure 6:
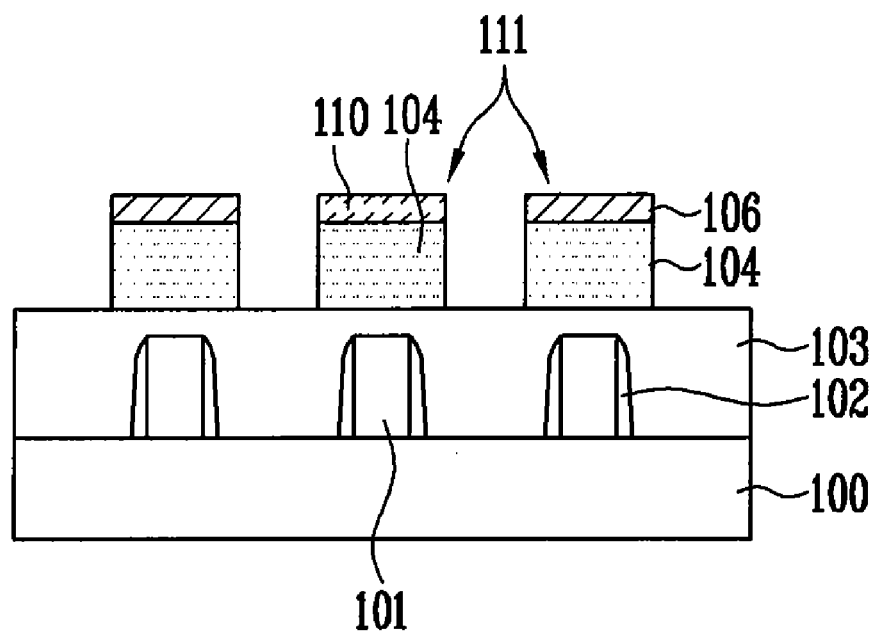

Referring to FIG. 6, some regions (region where subsequent contact holes are formed) of the interlayer insulating film 103 are exposed by an etch process employing the first patterns and the second patterns, thus forming hard mask patterns.

If the second patterns are formed using the spacers as described above, a hard mask pattern 111 having a pitch of 30 nm can be formed. In one embodiment, ASML 1400 ArF DRY equipment that has, for example, the resolution ability of 60 nm may be used for forming the hard mask pattern 111 That is, a pitch can be significantly reduced using the existing exposure equipment without investment in new exposure equipment.

Figure 7:
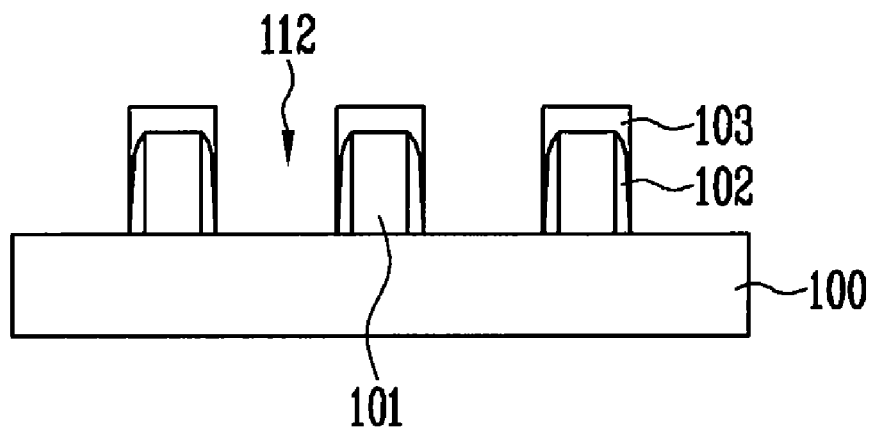

Referring to FIG. 7, contact holes 112 through which the semiconductor substrate 100 is exposed are formed using an etch process employing the hard mask patterns 111.

Though not shown in the drawing, the contact holes 112 may be gap-filled with a conductive material in order to form contacts connected to the junction region of the semiconductor substrate 100.

An example where the present invention is applied to a gate etch process of a flash memory device has been described. However, it is noted that the present invention may be applied to the entire etch processes necessary to fabricate semiconductor devices, such as a gate etch process, an isolation trench etch process and a contact etch process of all semiconductor devices, including DRAM and SRAM flash memory, etc. In particular, the present invention may be applied to the formation of a drain contact of a semiconductor device, a storage node contact (SNC) of DRAM, and the like.

In an aspect of one embodiment, at the time of a hard mask formation process for forming a contact hole of a semiconductor device, the first patterns are formed using the photoresist pattern employing an exposure process, the spacers having a predetermined thickness are formed on the sidewalls of the first patterns using the amorphous carbon layer. The spaces between the first patterns including the spacers are gap filled to form the second patterns. Accordingly, a contact hole having a pitch with exposure equipment resolutions or less can be formed.

Although the foregoing description has been made with reference to the specific embodiments, it is to be understood that changes and modifications of the present invention may be made by the ordinary skilled in the art without departing from the spirit and scope of the present invention and appended claims.

What is claimed is:

1. A method of forming a contact hole of a semiconductor memory device, the method comprising:
    forming an etch stop layer over a semiconductor substrate, wherein an interlayer insulating film and a hard mask film are formed between the semiconductor substrate and the etch stop layer;
    forming first patterns on the etch stop layer;
    forming spacers on sidewalls of the first patterns;
    forming second patterns by gap-filling an insulating film between the spacers;
    removing the spacers of a contact hole region; and
    forming a contact hole through which the semiconductor substrate is exposed using an etch process employing the first patterns, the second patterns and the spacers as an etch barrier.

2. The method of claim 1, wherein forming second patterns comprises:

forming the insulating film over the entire surface including the spacers;

etching the insulating film in a bit line direction on regions where subsequent contact holes are to be formed, wherein the insulating film formed on the spacers is removed; and forming the insulating film which remains through removal of the spacers, wherein the insulating film forms the second patterns.

3. The method of claim 1, wherein forming a contact hole comprises:

forming hard mask patterns by etching the etch stop layer and the hard mask film, wherein an etch process employing the first and second patterns is used; and etching the interlayer insulating film by using an etch process employing the hard mask patterns as an etch barrier.

4. The method of claim 1, wherein the spacers are formed using an amorphous carbon layer through a cycle of deposition and etch processes performed within a chamber.

5. The method of claim 1, wherein the insulating film is formed using a SOG layer.

6. The method of claim 1, wherein the etch stop layer is formed using a PE nitride film.

7. The method of claim 1, wherein a distance between the first pattern and the second pattern is controlled by adjusting a thickness of the spacer.

8. The method of claim 2, wherein the insulating film etch process is performed using a wet etch process.

9. The method of claim 2, further comprising, after the insulating film is gap-filled, hardening the insulating film by performing a curing process before etching the insulating film.

10. The method of claim 9, wherein the curing process is performed in a range of 150 to 250 degrees Celsius to prevent damage to the spacers.

11. A method of forming a contact hole of a semiconductor memory device, the method comprising:

forming a resultant structure over a semiconductor substrate in which gate patterns are formed, wherein the resultant structure comprises an interlayer insulating film, a hard mask film, an etch stop layer, and a polysilicon film;

patterning the polysilicon film to form first patterns;

forming spacers on sidewalls of the first patterns;

gap-filling an insulating film between the first patterns where the spacers are formed, thus forming second patterns;

by using an etch process, removing the spacers on a region where a contact hole is to be formed, wherein the etch stop layer is formed; and forming a contact hole through which the semiconductor substrate is exposed.

12. The method of claim 11, wherein forming the contact hole includes sequentially etching the exposed etch stop layer, the hard mask film, and interlayer insulating film.

* * * * *